United States Patent [19]

Hanes et al.

[11] 4,206,469
[45] Jun. 3, 1980

[54] POWER METAL-OXIDE-SEMICONDUCTOR-FIELD-EFFECT-TRANSISTOR

[75] Inventors: Maurice H. Hanes, Murrysville; Earl S. Schlegel, Plum Borough, both of Pa.

[73] Assignee: Westinghouse Electric Corp., Pittsburgh, Pa.

[21] Appl. No.: 942,580

[22] Filed: Sep. 15, 1978

[51] Int. Cl.² ............................................. H01L 29/72
[52] U.S. Cl. ........................................ 357/23; 357/22; 357/55; 357/68
[58] Field of Search ..................... 357/22, 23, 55, 68

[56] References Cited

U.S. PATENT DOCUMENTS

| | | | |
|---|---|---|---|
| 3,484,865 | 12/1969 | Nienhuis | 357/23 |
| 3,515,405 | 5/1970 | Carlson | 357/23 |
| 4,129,879 | 12/1978 | Tantraporn et al. | 357/23 |

Primary Examiner—Edward J. Wojciechowicz
Attorney, Agent, or Firm—B. W. McGee

[57] ABSTRACT

A planar high power Metal-Oxide-Semiconductor-Field-Effect-Transistor (MOSFET) including a substrate with an epitaxial layer on a surface thereof. A gate electrode including a strip of metal extending across a surface of the epitaxial layer and having a plurality of fingers extending therefrom along its length. The gate electrode being electrically insulated from the epitaxial layer by a layer of oxide. A source electrode in the surface of the epitaxial layer including fingers extending therefrom and interdigitating with the fingers of the gate electrode. There are p and n diffusion regions formed in the epitaxial layer except in an area under each of the gate fingers, which area remains undiffused. A drain electrode is connected to the surface of the substrate opposed to the surface upon which the epitaxial layer is deposited.

During operation of the MOSFET as the blocking voltage across the transistor increases and the transistor is in the OFF state, the horizontal components of fields from the adjacent and closely spaced p-regions cancel each other so that voltage breakdown due to junction curvature is avoided.

7 Claims, 20 Drawing Figures

POWER METAL-OXIDE-SEMICONDUCTOR-FIELD-EFFECT-TRANSISTOR

BACKGROUND OF THE INVENTION

1. Field of the Invention

This invention relates to high power Metal-Oxide-Semiconductor-Field-Effect-Transistors (MOSFET) and more particularly to high power MOSFET's having planar construction and high current handling capability per unit of chip area.

2. Description of the Prior Art

The trend in electrical power systems, especially in space, military and aviation systems, is towards higher frequency, voltage, and current. Recently, power semiconductor devices have been developed in MOS configurations. It appears that MOS devices can be designed to handle higher power in switching applications than either the bipolar or junction-field-effect-transistor (JFET) devices typically used in such applications. The attractive features of MOS devices include: no charge storage, therefore no delay time at turn-off; a positive temperature coefficient of resistance, therefore they can easily be operated in parallel; no secondary breakdown; and a high input impedance. The advantage of power MOS devices over JFET devices is that more channel width can be designed into a unit of chip area and more charge can be controlled per unit of channel area.

Sigg et al described a double-diffused device (D-MOS) in an article entitled "D-MOS Transistor for Microwave Applications" published in IEEE Transactions on Electron Devices, ED-19, 45–53 (1972). The D-MOS is of planar construction and a top surface contact is made to the drain. The design permits the device to support a high drain voltage and yet have a short channel length thereby providing a high transconductance. The gate oxide need not support the drain-to-source voltage, thereby allowing a much thinner gate oxide to be used and permitting control of the device with lower gate voltages. This further increases the transconductance.

Kooi and Ragle in an article, "MOS Moves Into Higher Power Applications", *Electronics*, June 24, 1976, described an anisotropically etched V groove (VMOS) and built short channel MOS transistors into the walls of the V groove. This design has the advantage that the drain contact is made on the bottom of the silicon slice and therefore a large amount of channel width can be packed into a given chip area increasing the transconductance. This design also has the desirable feature that the high drain voltage is supported away from the gate oxide.

Both of the above devices have the unattractive feature of high input capacitance because the gate metal overlaps the source. The V groove device has the disadvantage that the anisotropically etched V groove exposes the <111> planes with their characteristically high fixed charge density and low carrier mobility.

Oakes et al described a transistor built into U-shaped grooves in the silicon in an article entitled "A Power Silicon Microwave MOS Transistor" published in IEEE Transactions On Microwave Theory and Techniques, MTT-24, 306–311 (1976). This design possesses the advantages of the DMOS and the VMOS designs and has two additional advantages. A gate metal deposition technique is used that closely aligns the gate metal over the channel thereby providing a lower input capacitance. Because the anisotropic etch is not used, the device exhibits higher carrier mobility than does the V groove device. It is a good device for microwave frequency applications but would not be suitable for high power at low frequencies.

Yoshida et al described a high power MOS device in an article entitled "A High Power MOSFET With A Vertical Drain Electrode And Meshed Gate Structure", IEEE J. Solid State Circuits, SC-11, 472–477 (August 1976). The device can handle 200 watts (20 A, 100 V) and can be operated at 180° C. The device has two disadvantages, however. It is a p-channel device and thus does not take advantage of the higher mobility of electrons, and it has a very high input capacitance (2,000 pF).

SUMMARY OF THE INVENTION

A Metal-Oxide-Semiconductor-Field-Effect-Transistor (MOSFET) according to the present invention comprises a semiconductor wafer having major opposed top and bottom surfaces, on which top surface lies a metal source and a metal gate electrode having interdigited fingers. Diffusion regions are formed in the epitaxial layer except in an area under each of the gate electrode fingers, which area remains undiffused. A drain electrode is connected to the bottom of the semiconductor wafer.

More particularly, the MOSFET includes an epitaxial layer on a top surface of a semiconductor substrate having a first conductivity type. A first layer of oxide extends across the surface of the epitaxial layer and includes fingers extending therefrom on both sides along its length. Overlying the first layer of oxide including the fingers thereof is a layer of metal constituting a gate electrode. A layer of metal on one side of the gate electrode constitutes a source electrode and includes a plurality of fingers extending therefrom along its length and interdigitating with the fingers of the gate electrode. A second layer of metal on the other side of the gate electrode also constitutes a source electrode and includes a plurality of fingers extending therefrom and interdigitating with the fingers of the gate electrode on said other side. A first diffusion region having the second conductivity type is formed everywhere in said epitaxial layer except in an area under the fingers of the gate electrodes. A second diffusion region having the first conductivity type is formed in a portion of the first diffusion region thereby creating an area in the portion of the first diffusion region into which the second diffusion region is not diffused.

During operation, as the blocking voltage across the transistor increases and the transistor is in the OFF state, the electric fields from adjacent p-regions meet and overlap. The overlapping of the curvatures of the fields decreases the effective curvature of the equipotential lines near the junction where the fields overlap. As the blocking voltage increases, the overlap becomes greater and the effective curvature of the field at the junction decreases. Accordingly, increased field strength normally occurring due to field curvature is reduced and voltage breakdown due to this increased field strength is avoided.

DESCRIPTION OF THE PREFERRED EMBODIMENT

Figure 1:
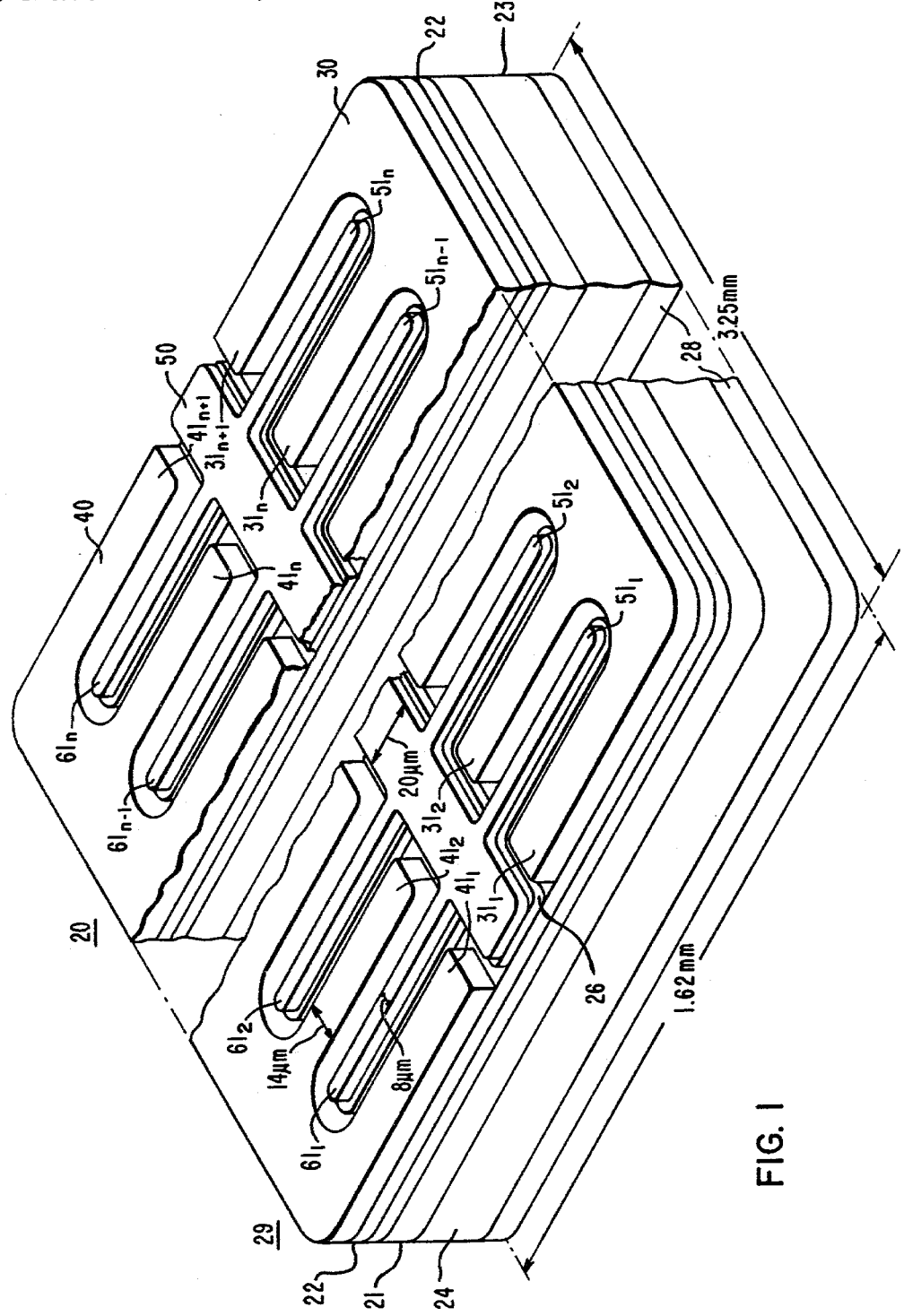
FIG. 1 shows a transistor according to the teachings of the present invention.

FIG. 1 shows a transistor 20 according to the teaching of the present invention. The transistor 20 includes a source electrode 30 comprising a layer of metal including a plurality of fingers extending therefrom, for example, fingers $31_1$ and $31_2$ through fingers $31_n$ and $31_{n+1}$, and comprising a layer of metal 40 including a plurality of fingers extending therefrom, for example, fingers $41_1$ and $41_2$ through fingers $41_n$ and $41_{n+1}$. The variable n is the number of fingers. The transistor 20 also includes a gate electrode 50, comprising a layer of metal, and includes a plurality of fingers, for example, fingers $51_1$ and $51_2$ through $51_{n-1}$ and $51_n$ which interdigitate with the fingers $31_1$ through $31_{n+1}$, and a series of fingers, for example, fingers $61_1$ and $61_2$ through fingers $61_{n-1}$ and $61_n$ which interdigitate with the fingers $41_1$ through $41_{n+1}$. The variable n represents the number of gate fingers.

In explaining the present invention, reference will be made to specific dimensions, which dimensions are those of a particularly satisfactory transistor which was designed incorporating the teachings of this invention.

The transistor 20 has a parallelopiped configuration having a side 21 which is parallel to the direction in which the fingers extend and is 1.62 mm long. A side 23 is perpendicular to the side 21 and is 3.25 mm long. The layer of metal 50 is elongated and is 20 $\mu$m wide and 3.25 mm long extending across the entire transistor parallel to the side 23. The fingers $61_1$ through $61_n$ and $51_1$ through $51_n$ extending from the gate metal 50 are each 8 $\mu$m wide and approximately 0.598 mm long. The fingers $31_1$ through $31_n$ and $41_1$ through $41_n$ extending from the source layers of metal 30 and 40, respectively are each 14 $\mu$m wide and approximately 0.598 mm long. In this particular embodiment n=125, the spacing between the interdigitated fingers is 2 $\mu$m wide.

An epitaxial layer 22 is disposed on a top surface of a silicon substrate 24. The epitaxial layer 22 has an N$^-$ doping concentration for providing a high resistivity. The substrate 24 has an N$^+$ doping concentration for providing a low resistivity. The doping concentration refers to the number X of donor atoms per cm$^3$. For a typical N$^+$ concentration $X > 10^{17}$ and for a typical N$^-$ concentration, $X < 10^{16}$. A layer of metal 28 constituting a drain electrode is disposed on a bottom surface of the substrate 24. The source electrodes 30 and 40, comprised of layers of metal are disposed on the top surface of the epitaxial layer 22. The gate electrode 50, however, is insulated from the epitaxial layer 22 by a layer of insulating material, for example a layer of silicon dioxide 26.

Figure 2:
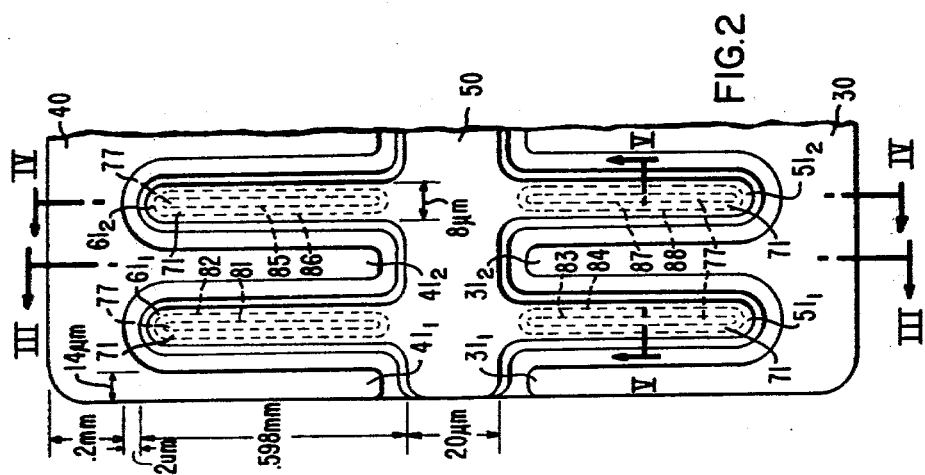
FIG. 2 shows a more detailed view of a portion of the transistor shown in FIG. 1.
Figure 3:
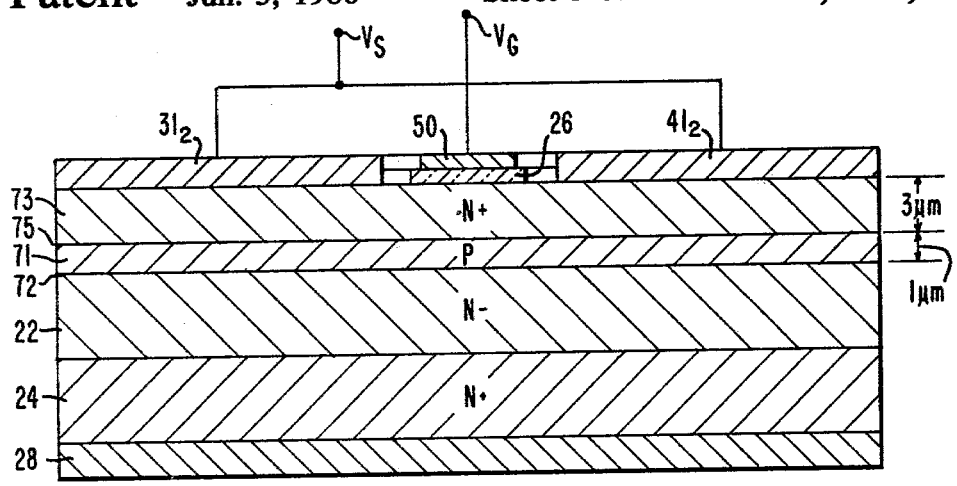
FIGS. 3, 4 and 5 are cross-sectional views of the transistor portion shown in FIG. 2.

A section 29 of the transistor 20 as shown in FIG. 1 is shown in greater detail in FIG. 2. FIG. 3 is a side view of the section of FIG. 2 taken along the lines III—III showing the structure of diffusion regions created under the fingers $31_2$ and $41_2$, for example. A p-type diffusion region 71 is created in the epitaxial layer 22 forming a p-n junction 72 therewith and extends across the entire width of the transistor 20. The region 71 extends to a depth of about 4 $\mu$m into the epitaxial layer 22. An n-type diffusion region 73 is formed in a portion of the p-type diffusion region 71 forming a p-n junction 75 therewith and similarly extends across the entire width of the transistor 20. The region 73 extends to a depth of about 3 $\mu$m into the p-diffusion region 71. The p-type region 71 and the n-type region 73 can be deeper or shallower so long as the region 71 is approximately 1 $\mu$m deeper than the region 73.

Figure 4:
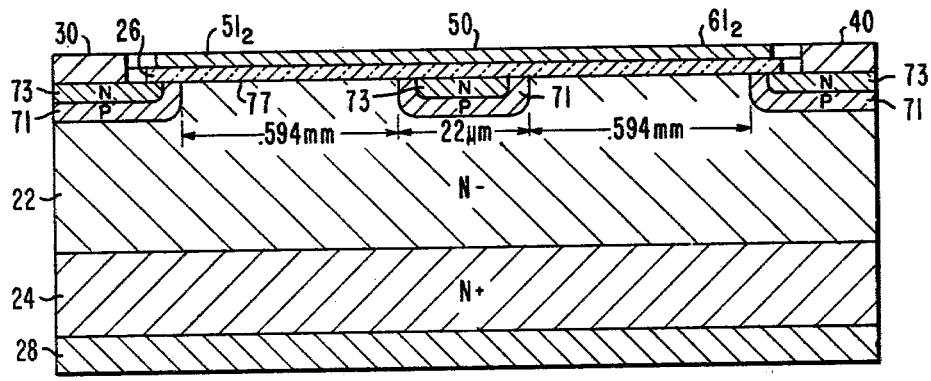

FIG. 4 is a side view of FIG. 2 taken along the lines IV—IV showing the structure of the diffusion regions 71 and 73 under the fingers $51_2$ and $61_2$, for example. A portion 77 of the area in the epitaxial layer 22 under the gate fingers $51_2$ and $61_2$ is undiffused. A top view of the diffusion regions 71 and 73 in the epitaxial layer 22 under the fingers $51_1$, $51_2$, $61_1$ and $61_2$, for example, is shown in FIG. 2 by the dashed lines 81 through 88. Within the lines at 81, 83, 85, and 87 are undiffused regions 77 in the epitaxial layer 22. Between the dashed lines 81 and 82, 83 and 84, 85 and 86, and 87 and 88 are the p-type diffusion regions 71. The entire area outside the p-diffusion regions 71 comprises the n-type diffusion region 73.

Figure 5:
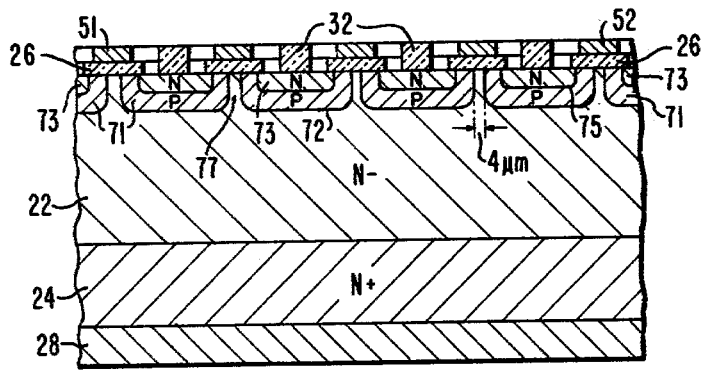
Figure 6:
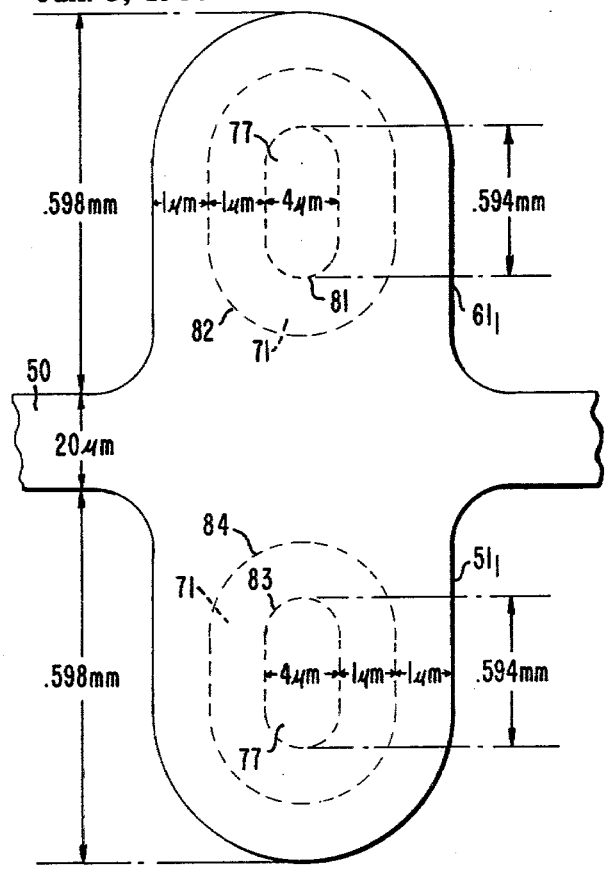
FIG. 6 is a more detailed view of a pair of gate fingers according to the transistor of the present invention.

FIG. 5 shows a view of the section of the transistor 20 shown in FIG. 2 cut along the lines V—V. The width of the undiffused region 77 is less in this dimension than in the dimension shown by the view IV—IV of FIG. 4 since the diffusion region 71 and therefore the undiffused region 77 will typically be oblong in shape. FIG. 6 shows a more detailed view of the fingers $61_1$ and $51_1$ of FIG. 2 and the diffusion regions 71 and 73 thereunder. The region 77 is 0.594 mm long and 4 $\mu$m wide. The region 71 is 0.596 mm long and 6 $\mu$m wide. The regions 71 and 77 are centered under the fingers $51_1$ and $61_1$ such that the fingers overlap by a uniform spacing of 1 $\mu$m.

Figure 7:
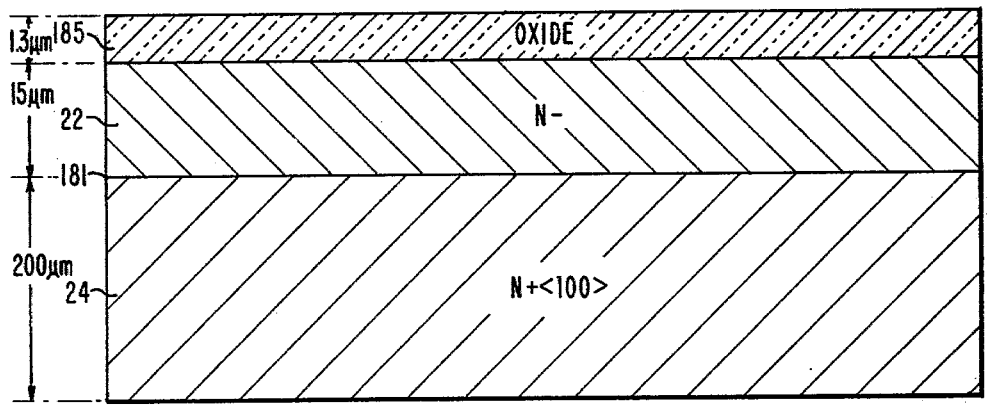

In the method of manufacturing a transistor according to the teaching of the present invention, the N$^-$ epitaxial layer 22 is grown on a top surface 181 of the substrate 24 as shown in FIG. 7. The substrate 24 is 200 $\mu$m thick and preferably consists of N$^+$ silicon with a <100> crystal orientation. The N$^+$ doping is effective to provide for a low resistance in order to minimize the resistance heating effect in high power-high current operation. The <100> crystal orientation is effective to provide for a low fixed surface charge density and a high surface mobility. This lowers the device threshold voltage and increases the transconductance. The epitaxial layer 22 is preferably 15 $\mu$m thick and is doped at a level of approximately $1 \times 10^{+15}$/cm$^3$. In general, the thickness and doping level are determined by the maximum voltage that the transistor is desired to support in the OFF state. The low N$^-$ doping is effective to allow the widening of a depletion layer in the epitaxial layer 22. A layer of thermal oxide 185 is grown on the epitaxial layer 22 to a thickness of between about 0.9 $\mu$m and 2.0 $\mu$m but preferably 1.3 $\mu$m. In any case, the layer of oxide 185 must be thick enough to effectively mask a diffusion but thin enough so that it won't crack when exposed to temperature changes.

Figure 8:
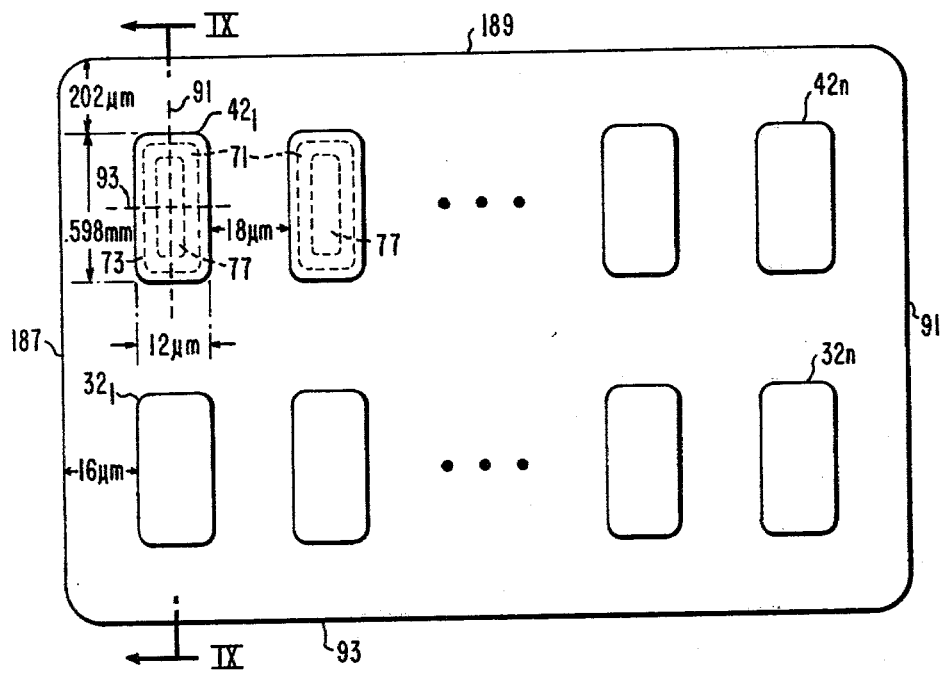
Figure 9:
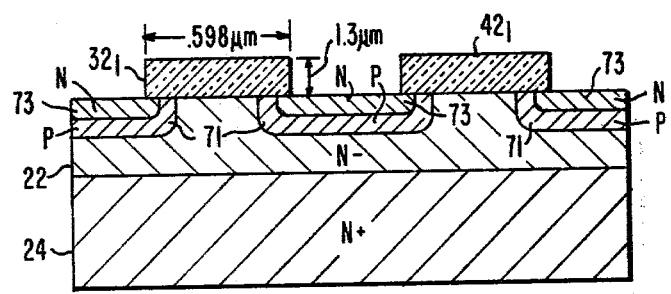

The oxide layer 185 is masked and etched in order to form a row of oxide islands $42_1$ through $42_n$ having surfaces of oval-like or oblong shape and spaced at intervals of approximately 18 μm across the surface of the epitaxial layer 22. The pattern is illustrated in FIG. 8. Each of the islands $42_1$ through $42_n$ has a principal axis parallel to a side 187, for example, principal axis 91 of island $42_1$, and each has a minor axis perpendicular to the side 187, for example, minor axis 93 of island $42_1$. Each of the islands $42_1$ through $42_n$ is 0.598 mm long through its principal axis and 8 μm wide through its minor axis. The island $42_1$ is 16 μm from the edge 187 and 202 μm from an edge 189 perpendicular to the edge 187. The island $42_n$ is similarly situated with respect to an edge 91 of chip 20 opposite the edge 187. The etchant can be any substance which controllably etches silicon dioxide, but is preferably buffered hydrofluoric acid. A row of oxide islands $32_1$ through $32_n$ is similarly masked and etched on the surface of the oxide layer 185 parallel to the row of islands $42_1$ through $42_n$. The islands $32_1$ through $32_n$ each has dimensions and locus with reference to the edge 87 and an edge 93 similar to the dimensions and locus of the islands $42_1$ through $42_n$ with reference to the edges 87 and 89. A substance forming acceptors in silicon, preferably boron, is diffused in the areas of the epitaxial layer 22 not covered by the islands $32_1$ through $32_n$ and $42_1$ through $42_n$ for creating the p-diffusion regions 71. A substance forming donor atoms in silicon, preferably phosphorus, is similarly diffused in order to create the n-diffusion regions 73. The use of the same oxide mask to make both difffusions assures the correct alignment of the diffusions. Poor alignment of the diffusion regions 71 and 73 may cause poor distribution of the switching current in the diffusion regions thereby causing undue generation of heat resulting in poor overall device performance. Metal for the source contact will subsequently be deposited over the diffusion regions 73. A side view of FIG. 8 along the lines IX—IX is shown in FIG. 9.

Figure 10:
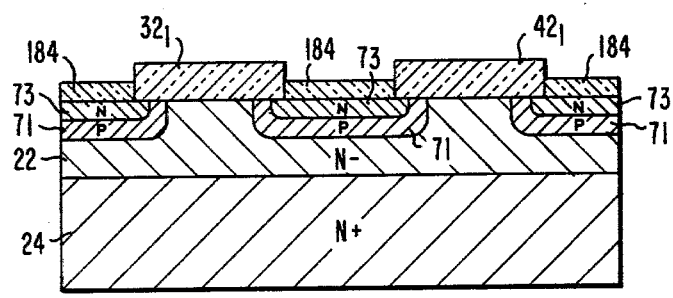
Figure 11:
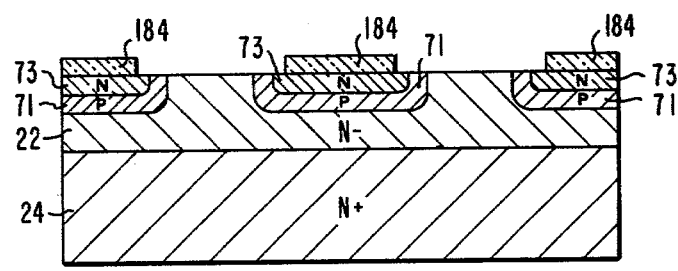
Figure 12:
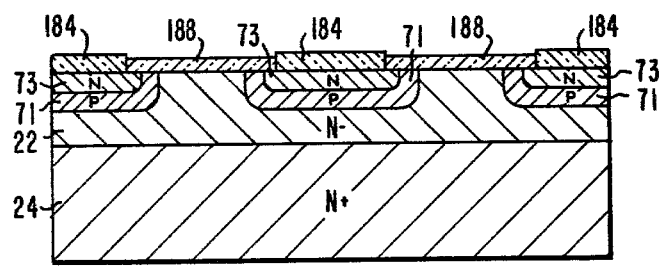

A thin layer of oxide 184 is thermally grown over the surface of the device of FIG. 8. This step is shown in FIG. 10. Next, the islands $32_1$ through $32_n$ and $42_1$ through $42_n$ are masked and etched away as shown in FIG. 11, leaving only the thin oxide layer 184 overlaying a portion of the n region 73. A second thin layer of oxide 188 is thermally grown over the surface of the device of FIG. 11 as shown in FIG. 12, including the exposed surfaces of the epitaxial layer 22 and the thin oxide layer 184 in order to form the oxide insulation for the subsequently formed gate metal layer. The oxide layer 188 is preferably about 1200 Å to 1600 Å thick so long as it is thick enough to support the gate voltages and thin enough to give good transconductance. The oxide layer 184 is masked and etched away to the surface of the epitaxial layer 22 forming a pattern of fingers 95 as shown in FIG. 13 in which pattern the source metal will subsequently be formed.

Figure 13:
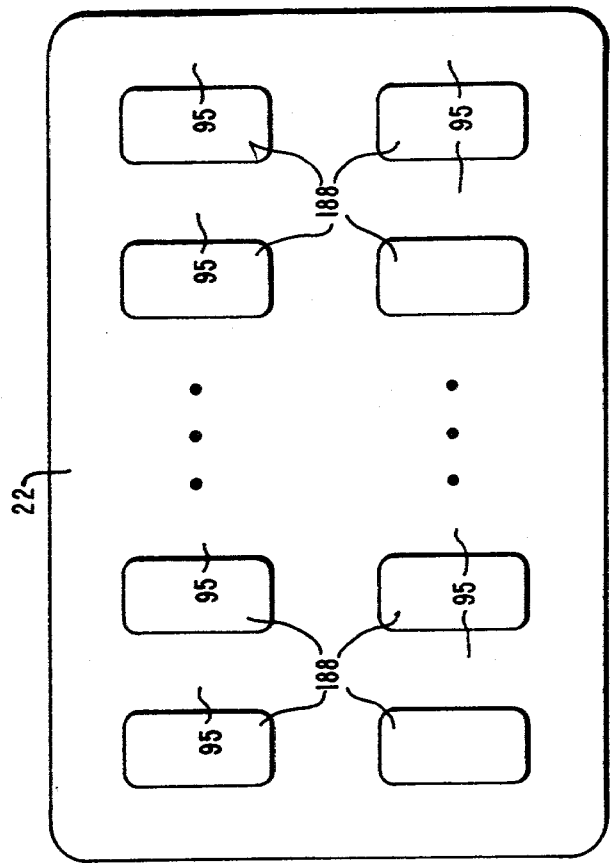
FIGS. 7 through 16 illustrate steps in a method for manufacturing the transistor of the present invention.
Figure 14:
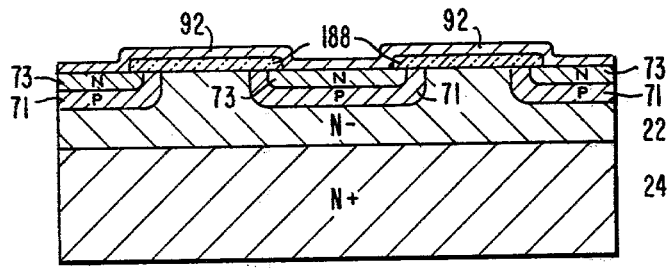

A surface layer of metal 92 as shown in FIG. 14 is deposited by vacuum evaporation, for example, over the entire top surface of the device of FIG. 13. The source metal 92 includes, for example, layers of titanium, palladium, and gold, which are very chemically reactive with oxide and silicon, so as to form a satisfactory chemical bond with the surfaces on which it is deposited. The source metal 92 is preferably 6000 Å thick but can be anywhere from 6,000–10,000 Å thick.

Figure 15:
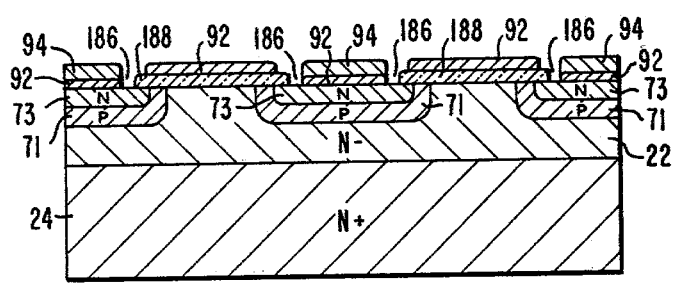
Figure 16:
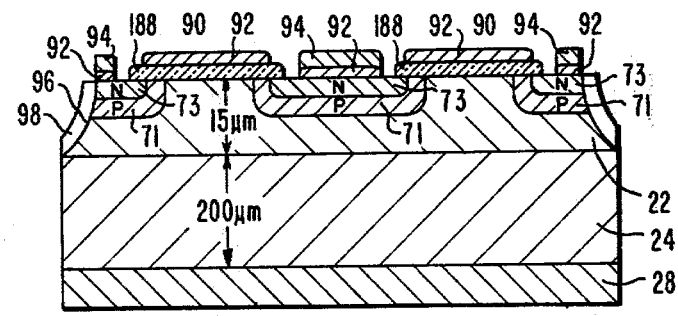

Portions of the metal layer 92 are photolithographically etched as shown in FIG. 15 so as to separate the source and gate metal contacts as shown in FIG. 15 by the spaces 186. The separation or spaces 186 should be of a distance, for example, at least 2 μm so as to eliminate the possibility of a short between the gate and source contacts. A drain is formed by electroplating a layer of metal 28 to the underside of the substrate 24 as shown in FIG. 16.

An additional layer of metal 94 is electroplated on the source metal contacts 92 in a conventional manner in order to build up or increase the metal thickness and thereby lower the source resistance. The edges of the chip shown in FIG. 13 are mesa etched in the epitaxial layer 22 and passivated in a conventional manner. FIG. 16 shows the view of the device as shown in FIG. 15 having a mesa etched edge 96 and a passivation layer 98. The passivating material is preferably a silicone varnish or silicone rubber like that in common use throughout the semiconductor device industry. The diffusion regions 71 and 73 adjacent to the passivated edge 96 have no curvature where the regions meet the edge 96.

Figure 17:
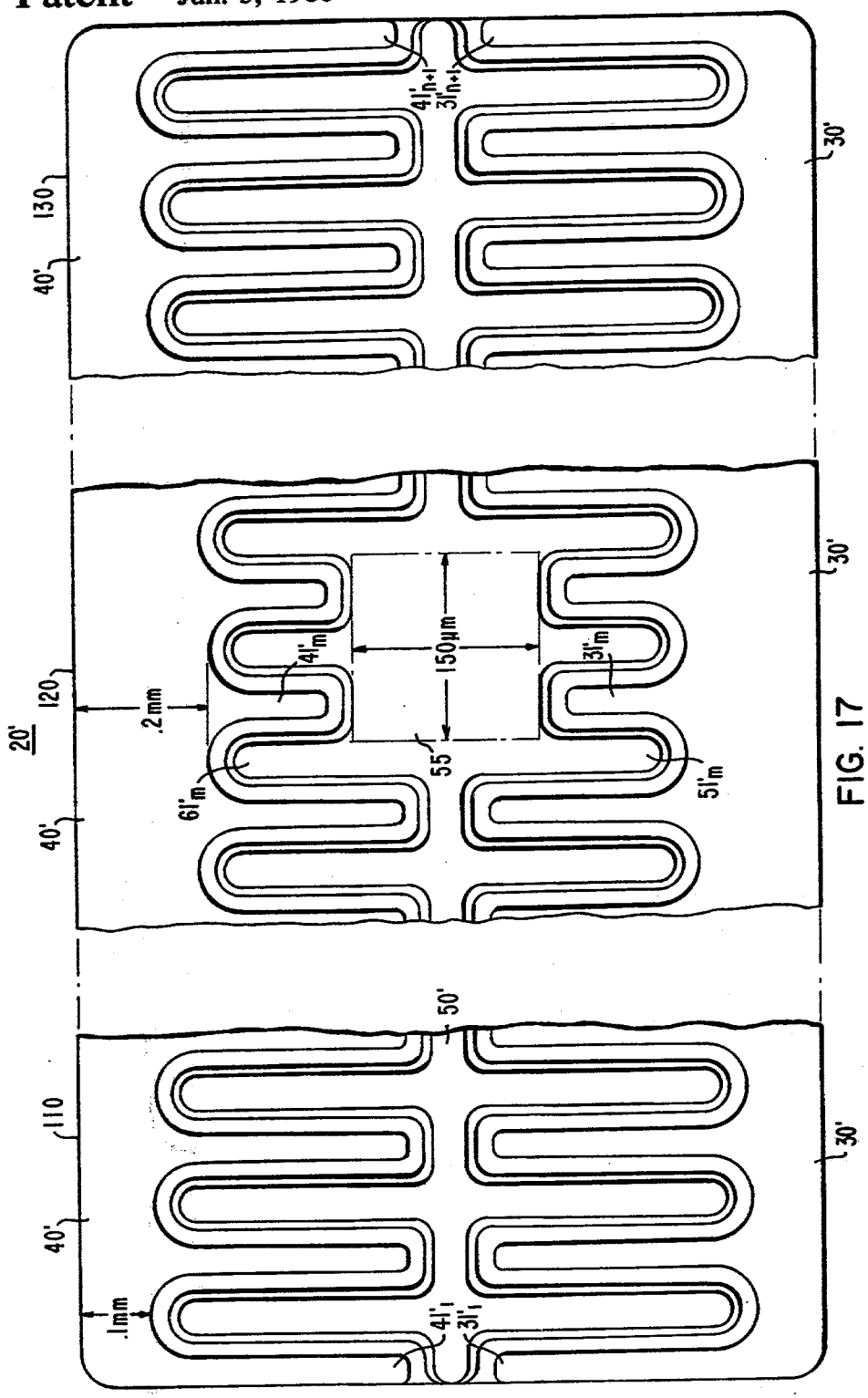
FIGS. 17 and 18 show another embodiment of the transistor of the present invention.

In order to save chip area and increase current capacity, the source metal at the base of the fingers can be tapered on both sides of the center. FIG. 17 shows such a taper in the device of FIG. 1. FIG. 17 shows a source layer of metal 40' having a width of 0.2 mm in the center of a center section 120 and tapering off to a width of 0.1 mm on either side of the center in end sections 110 and 130. A source layer of metal 30' has similar dimensions to the source layer of metal 40'. The spacing between the fingers remains uniform at 2 μm. Therefore, the fingers extending from either side of the sources 40' and 30' and the fingers extending from the gate metal 50' must be longer at the edges of the transistor than in the center thereof. For example, the fingers $41_1'$ and $31_1'$ and the fingers $41_{n+1}'$ and $31_{n+1}'$ are approximately 0.698 mm long.

Also, as a practical matter, the gate metal 50' includes in the center thereof a 150 μm×150 μm pad 55. The spacing between the fingers remains uniform at 2 μm. Therefore, the fingers extending from the sources 30' and 40' in the vicinity of the pad 55 and the fingers extending from the pad 55 must be shorter than the surrounding fingers. For example, the fingers $51_m$ and $61_m$ and the fingers $31_m$ and $41_m$ are approximately 0.533 mm long (where m=a number between 1 and n).

Figure 18:
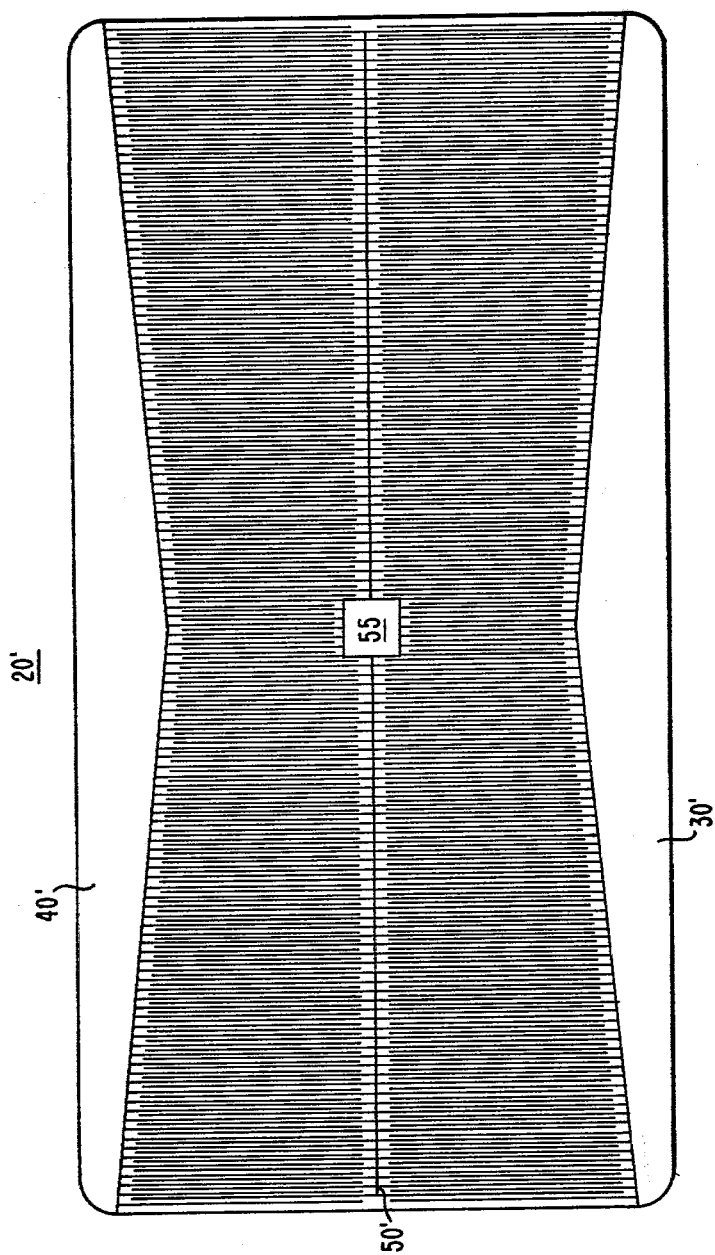

FIG. 18 shows a view of a transistor according to the embodiment of the invention shown in FIG. 17 wherein the component parts of the transistor are in more realistic proportion.

In operation of the power transistor of the present invention, adjacent p-regions, i.e., regions 71, are very closely spaced according to the teachings of the present invention. As the voltage across the transistor increases and the transistor is in the OFF state, the fields from adjacent p-n junctions meet and the horizontal components thereof oppose and cancel each other so that avalanche voltage is not unnecessarily lowered because of junction curvature.

Figure 19:
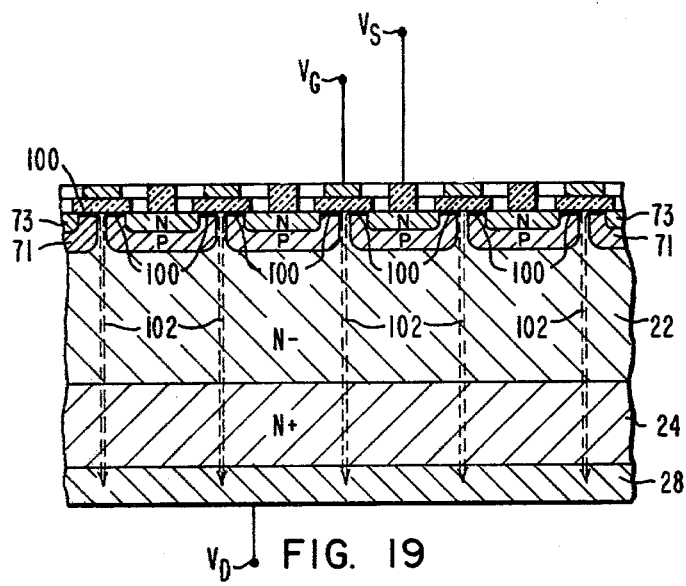
FIG. 19 shows power connections necessary for proper operation of the transistor of the present invention.

FIG. 19 will be used to illustrate the operation of the present invention. FIG. 19 shows a view similar to that shown in FIG. 5. In FIG. 19, a voltage potential $V_D$ is applied to the drain electrode 28. Voltage potentials $V_G$ and $V_S$ are applied to the gate electrode and source electrode fingers, respectively. In particular, $V_S$ is at ground potential and $V_D$ is a positive potential of from 3-4 V to 200 V. When zero bias is on the gate, i.e., $V_G = 0V$, the transistor is in the OFF state.

When $V_G$ is a positive potential of about 5 V to 25 V, an inversion layer 100 is created in the p-regions at the surface of the epitaxial layer 22 and the transistor turns ON. This inversion layer 100, which is a layer of electrons, carries current from the source region 73 through the p-region 71. Current is carried by majority carriers through the epitaxial layer 22 and the substrate 24 (the drain region) to the drain electrode 28. The device possesses a short channel length and wide channel width per unit of chip area and gives the present invention a high current carrying capacity with a low voltage drop. The channel length is determined by the thickness of the p-region 71 which, according to the teachings of the present invention, is 1 μm.

Figure 20:
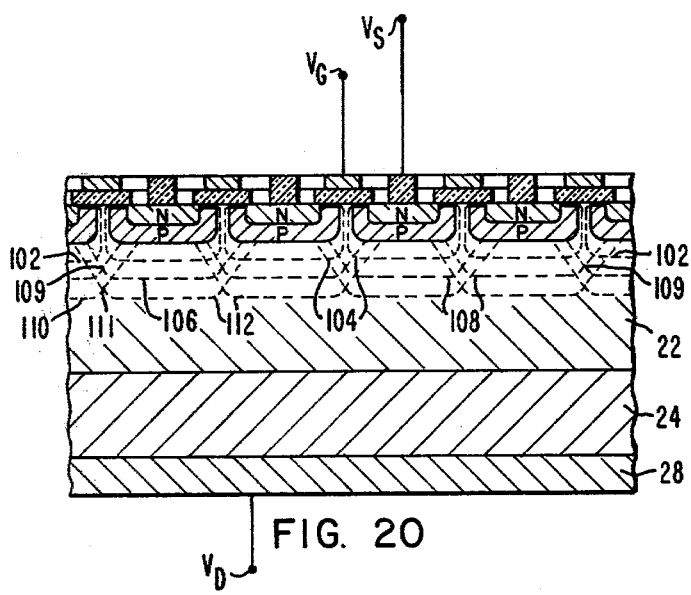
FIG. 20 illustrates the development of certain equipotential lines in the transistor of the present invention at low, medium, and high voltages when the transistor is OFF.

The blocking voltage capability of the present invention can be explained as follows with the aid of FIG. 20. FIG. 20 shows a view similar to that shown in FIG. 19, except that certain reference characters included in FIG. 19 are omitted in FIG. 20 in order to more clearly illustrate the development of the depletion region as voltage is increased. When the transistor is OFF, i.e., when the gate voltage $V_G$ is 0V, the transistor must block the full drain voltage, $V_D$. The maximum voltage intended to be blocked will determine the required thickness and doping concentration of the epitaxial layer 22.

According to the teachings of the present invention, a silicon epitaxial layer of approximately 15 μm is required in order to safely support a reverse voltage of 200 at a doping concentration of $10^{+15}$ donor atoms/cm$^3$. At a low level of $V_D$, for example, approximately 1 V, the depletion regions from the p-regions 71 can be illustrated by the dotted lines at 102, for example. At such low levels, the equipotential surfaces 104 do not meet and, therefore, the full field strength is developed at the curvatures 104. At an intermediate $V_D$, for example, approximately 5 V, the field from the p-regions 71 can be illustrated by the dotted lines at 106, for example. At this intermediate voltage, depletion regions 108 meet as indicated at 109. The effective curvatures of the equipotential surfaces are reduced, thereby lowering the maximum field strength at 109 due to the partial cancellation of the horizontal components of fields from opposing p-n junctions. At high levels of $V_D$, for example, 175 V, the field from the p-regions 71 can be illustrated by the dotted lines at 110, for example. At such high voltage levels, junction curvatures 112 meet as indicated at 111. The equipotential surfaces are curved very little at this point and the field strength existing there is correspondingly reduced, thereby reducing the degrading effects of increased field strength at curved p-n junctions on avalanche voltage.

An additional feature of the present invention is that the drain contact 28 is on the bottom of the transistor, thereby providing increased current-carrying capacity for the total transistor chip.

It is to be understood that the above references to low, medium, and high voltage levels are only illustrative and are not meant to limit the scope of the present invention in any way.

We claim:

1. A power metal-oxide-semiconductor-field-effect-transistor (MOSFET) comprising:
   a planar substrate having top and bottom surfaces, and having a first type of conductivity and a first doping concentration;
   a planar epitaxial layer on the top surface of said substrate, said epitaxial layer having said first conductivity type and a second doping concentration on the order of $10^{14}$ impurity particles/cm$^3$;
   a source electrode disposed on the surface of said epitaxial layer including two fingers extending therefrom;
   a gate electrode including one finger extending therefrom, said one finger interdigitated with said at least two fingers of said source electrode, said gate electrode being insulated from said epitaxial layer by a layer of insulating material disposed therebetween;
   said epitaxial layer including a first semiconductor region for each of the fingers of said source electrode, said first regions having a second conductivity type, a second semiconductor region having said first conductivity type in a portion of each of said first semiconductor region, said second semiconductor regions each extending to the surface of said epitaxial layer, an epitaxial region extending between said first region, said source electrode disposed on said epitaxial layer over a portion of each of said second semiconductor regions, said gate electrode disposed over said epitaxial region;
   said first regions spaced apart from each other a predetermined distance for producing opposing electric fields in response to a voltage greater than a predetermined bias voltage applied across said source and drain electrodes;
   a drain electrode disposed on the bottom surface of said substrate.

2. A planar metal-oxide-semiconductor-field-effect-transistor (MOSFET) comprising:
   a planar substrate having top and bottom surfaces, and having a first type of conductivity and a first doping concentration;
   a planar epitaxial layer on the top surface of said substrate, said epitaxial layer having said first conductivity type and a second doping concentration on the order of $10^{14}$ impurity particles/cm$^3$;
   a source electrode disposed on the surface of said epitaxial layer including a first plurality of fingers extending therefrom;
   a gate electrode including a second plurality of fingers interdigitating with the fingers of said source electrode, said gate electrode being insulated from said epitaxial layer by a layer of insulating material disposed therebetween;
   said epitaxial layer including a first semiconductor region for each of the fingers of said source electrode, said first regions having a second conductivity type, a second semiconductor region in a portion of each said first semiconductor regions, said second semiconductor region each extending to the surface of said epitaxial layer, an epitaxial region extending between said first semiconductor regions;
   said source electrode disposed on said epitaxial layer over each of said second semiconductor regions, said gate electrode disposed over said epitaxial region;
   said first region spaced apart from each other a predetermined distance for producing opposing electric fields in response to a voltage greater than a predetermined bias voltage applied across said source and drain electrodes;

a drain electrode disposed on the bottom surface of said substrate.

3. A transistor according to claim 2:
wherein said second plurality of fingers includes third and fourth pluralities of fingers, said gate electrode including a first elongated section of metal having said third plurality of fingers extending therefrom on a first side along the length thereof and having said fourth plurality of fingers extending therefrom on a second side along the length thereof; and
wherein said first plurality of fingers includes fifth and sixth pluralities of fingers, a second elongated section of metal having said fifth plurality of fingers extending therefrom and interdigitating with said third plurality of fingers, and a third elongated section of metal having said sixth plurality of fingers extending therefrom and interdigitating with said fourth plurality of fingers.

4. A transistor according to claim 2 wherein: said first type of conductivity is n-type, and said second type of conductivity is p-type.

5. A transistor according to claim 2 wherein: said first doping concentration is greater than or equal to $10^{18}$ doner atoms/cm$^3$, and said second doping concentration is less than or equal to $10^{17}$ donor atoms/cm$^3$.

6. A transistor according to claim 2 wherein said first region is 1 $\mu$m deeper than said second region.

7. A planar metal-oxide-semiconductor-field-effect-transistor (MOSFET) comprising:
an n-type silicon substrate having top and bottom surfaces, said substrate having a doping concentration of at least $10^{18}$ donor atoms/cm$^3$;
an n-type silicon epitaxial layer having top and bottom surfaces, the bottom surface of said epitaxial layer disposed on the top surface of said substrate, said epitaxial layer having a doping concentration of $1 \times 10^{+15}$/cm$^3$ and having a depth of 15 $\mu$m;
a gate electrode including a first elongated section of a first metal, said first metal being comprised of layers of titanium, palladium, and gold, said first section of metal including a first plurality of fingers extending therefrom on a first side and a second plurality of fingers extending therefrom on a second side;
a source electrode including a second elongated section of said first metal, said second section of metal including a third plurality of fingers extending therefrom and interdigitating with said first plurality of fingers, whereby a finger of said third plurality of fingers is always between two fingers of said first plurality of fingers, said source electrode also including a third elongated section of said metal, said third section of metal including a fourth plurality of fingers extending therefrom and interdigitating with said second plurality of fingers, whereby a finger of said fourth plurality of fingers, said source also including a layer of a second metal disposed on the second and third sections of said first metal, said second metal including aluminum;
said epitaxial layer including a plurality of spaced-apart semiconductor regions, each of which extending to the top surface of said epitaxial layer, and including an epitaxial region extending between adjacent ones of said spaced-apart semiconductor regions to the top surface of the epitaxial layer, said spaced-apart semiconductor regions each including a p-type semiconductor subregion extending to the top surface of said epitaxial layer and including an n-type semiconductor subregion centered in said p-type semiconductor region and extending to the top surface of said epitaxial layer, said p-type region having a depth of 4 $\mu$m from the top surface of said epitaxial layer, said n-type semiconductor region having a depth of 3 $\mu$m from the top surface of said epitaxial layer and having a doping concentration of at least $10^{18}$ atoms/cm$^3$;
said gate electrode including the first and second plurality of fingers of said gate electrode disposed over said epitaxial region and over the p-type semiconductor subregion of said spaced-apart semiconductor regions, said MOSFET including means for insulating said gate electrode from the top surface of said epitaxial layer, said source electrode, including said third and fourth plurality of fingers, disposed on the top surface of said epitaxial layer over a center portion of the n-type semiconductor subregion of the spaced-apart semiconductor regions;
said semiconductor regions spaced apart a predetermined distance for producing opposing electric fields in response to a voltage greater than a predetermined bias voltage applied across said source and drain electrodes;
a drain electrode including a layer of said first metal disposed on the bottom surface of said substrate.

* * * * *